United States Patent
Huang

(10) Patent No.: US 7,309,641 B2
(45) Date of Patent: Dec. 18, 2007

(54) METHOD FOR ROUNDING BOTTOM CORNERS OF TRENCH AND SHALLOW TRENCH ISOLATION PROCESS

(75) Inventor: Kao-Su Huang, Yongkang (TW)

(73) Assignee: United Microelectronics Corp., Hsinchu (TW)

( * ) Notice: Subject to any disclaimer, the term of this patent is extended or adjusted under 35 U.S.C. 154(b) by 1 day.

(21) Appl. No.: 10/997,507

(22) Filed: Nov. 24, 2004

(65) Prior Publication Data

US 2006/0110891 A1    May 25, 2006

(51) Int. Cl.
*H01L 21/76* (2006.01)
*H01L 21/3065* (2006.01)

(52) U.S. Cl. .................. 438/444; 438/700; 438/719; 216/17; 216/39; 216/67; 216/79

(58) Field of Classification Search ............. 438/700, 438/701, 719, 444, 710; 216/17, 19, 67, 216/79, 39
See application file for complete search history.

(56) References Cited

U.S. PATENT DOCUMENTS

| | | | | |
|---|---|---|---|---|
| 4,729,815 A | * | 3/1988 | Leung | 438/714 |
| 5,423,941 A | * | 6/1995 | Komura et al. | 438/700 |
| 5,843,226 A | * | 12/1998 | Zhao et al. | 117/97 |
| 5,933,748 A | * | 8/1999 | Chou et al. | 438/431 |
| 6,008,131 A | | 12/1999 | Chen | 438/710 |
| 6,191,043 B1 | * | 2/2001 | McReynolds | 438/710 |
| 6,235,643 B1 | * | 5/2001 | Mui et al. | 438/719 |
| 6,318,384 B1 | * | 11/2001 | Khan et al. | 134/22.1 |
| 6,544,860 B1 | * | 4/2003 | Singh | 438/424 |
| 6,677,242 B1 | * | 1/2004 | Liu et al. | 438/706 |
| 6,746,961 B2 | * | 6/2004 | Ni et al. | 438/700 |
| 6,890,859 B1 | * | 5/2005 | Bamnolker et al. | 438/700 |
| 6,921,724 B2 | * | 7/2005 | Kamp et al. | 438/715 |

FOREIGN PATENT DOCUMENTS

JP    05-226298    *    3/1993

OTHER PUBLICATIONS

Seki Tetsuya (JP 05-226298), Apr. 1993, Translation.*

* cited by examiner

*Primary Examiner*—M. Wilczewski
(74) *Attorney, Agent, or Firm*—J.C. Patents

(57) ABSTRACT

A method for rounding the bottom corners of a trench is described. In the method, an etching process is performed using a fluorocarbon compound with at least two carbon atoms, He and $O_2$ as an etching gas to round the bottom corners of the trench.

22 Claims, 3 Drawing Sheets

METHOD FOR ROUNDING BOTTOM CORNERS OF TRENCH AND SHALLOW TRENCH ISOLATION PROCESS

BACKGROUND OF THE INVENTION

1. Field of the Invention

The present invention relates to a semiconductor process. More particularly, the present invention relates to a method for rounding the bottom corners of a trench and a shallow trench isolation (STI) process.

2. Description of the Related Art

Due to the rapid development of integrated circuit technologies, device miniaturization and integration are the major trends in semiconductor manufacturing industry. As the dimension of device continues to be shrunk and the degree of integration continues to be increased, isolation structures have to be miniaturized correspondingly. Hence, with device miniaturization, isolating structures are increasingly difficult to fabricate. The preferred isolation structure for sub-micron MOS devices is the STI structure, because it is scalable without causing any bird's beak encroachment problem as in the conventional local oxidation of silicon (LOCOS) process.

In a conventional STI process, a patterned mask layer is firstly formed on a substrate. Thereafter, the substrate is etched using the patterned mask layer as a mask to form a trench therein. Then, an etching process is performed using $Cl_2$ or HBr as an etching gas to remove polymer residues at the bottom of the trench and to round the sharp bottom corners of the trench to avoid high stress or point discharge thereat. Next, an insulation material is deposited to fill the trench, and then a chemical mechanical polishing process is performed to remove the insulation material outside the trench. Finally, the patterned mask layer is removed.

However, when the device linewidth becomes smaller, for example, under 90 nm, it is difficult to round the bottom corners of each trench (100) with $Cl_2$ or HBr as an etching gas, as shown in FIG. 1. Moreover, the polymer residues 102 at the bottom of each trench 100 cannot be removed. This may result in some problems, such as, high stress or point discharge, at the bottom corners 104 of each trench 100.

SUMMARY OF THE INVENTION

Accordingly, the present invention provides a method for rounding the bottom corners of a trench and a STI process wherein the bottom corners of the trench is rounded effectively.

In the method for rounding the bottom corners of a trench of the invention, an etching process is performed using a fluorocarbon compound with at least two carbon atoms, He and $O_2$ as an etching gas to round the bottom corners of the trench.

The STI process of the invention is described as follows. In this process, a mask layer is formed on a substrate first, wherein the mask layer has an opening therein exposing a portion of the substrate. Next, a portion of the substrate exposed by the opening is removed to form a trench. Thereafter, an etching process is performed using a fluorocarbon compound with at least two carbon atoms, He and $O_2$ as an etching gas to round the bottom corners of the trench. An insulation material is then filled in the trench.

By using a fluorocarbon compound with at least two carbon atoms, He and $O_2$ as an etching gas, the polymer residues at the bottom of the trench can be removed completely, and the bottom corners of the trench can be rounded effectively. Therefore, the problems in the prior art, such as, high stress or point discharge, can be solved.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
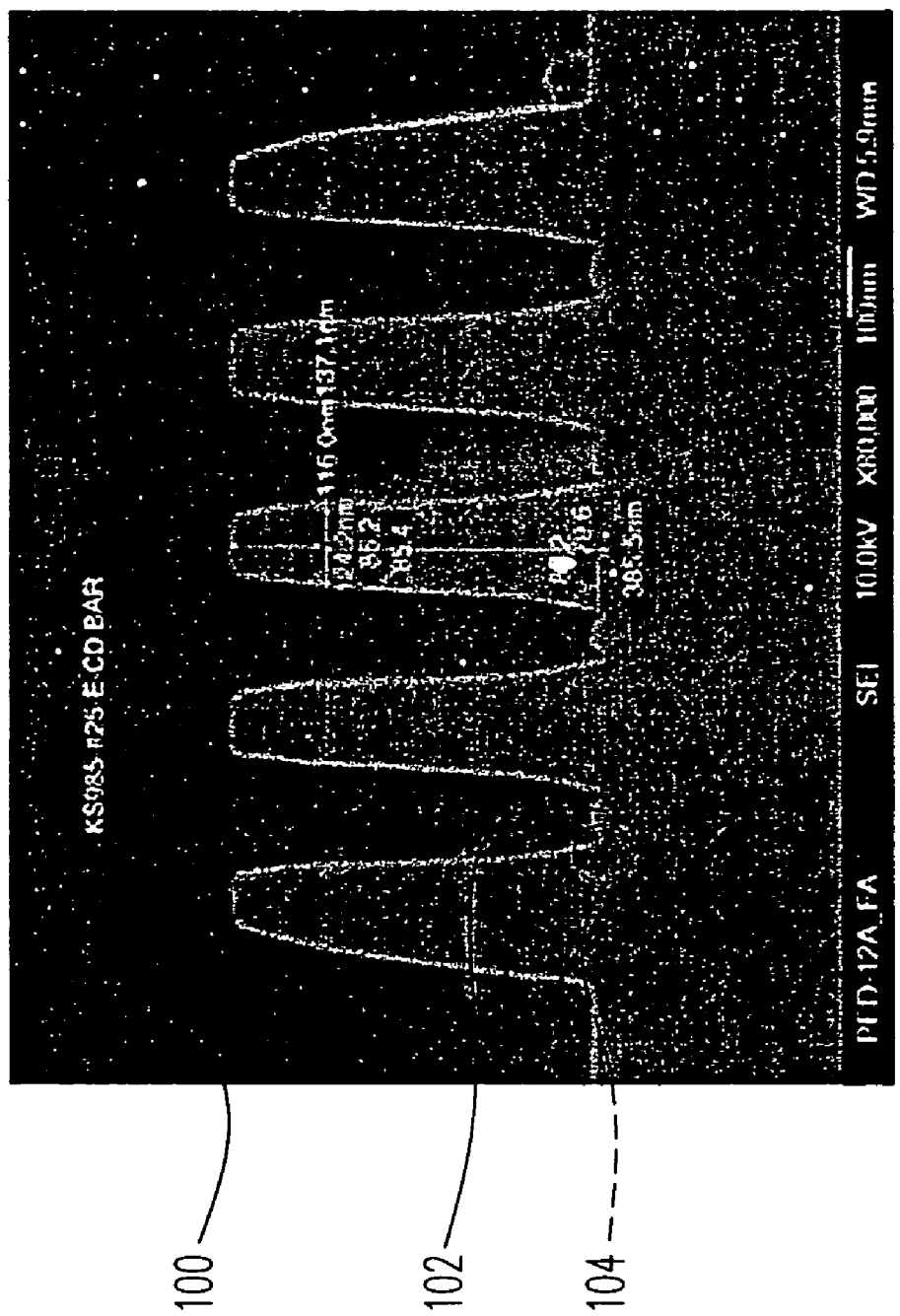
FIG. 1 is a photograph showing a cross-section of the shallow trenches fabricated with the conventional method.

Reference will now be made in detail to the present preferred embodiments of the invention, an example of which is illustrated in the accompanying drawings. Wherever possible, the same reference numbers are used in the drawings and the description to refer to the same or like parts.

Figure 2A:
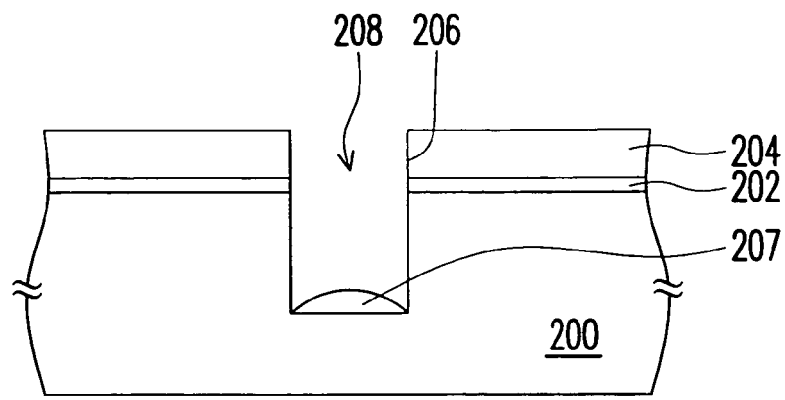
FIGS. 2A through 2C are schematic cross-sectional views showing the steps of a STI process according to a preferred embodiment of this invention.
Figure 2B:
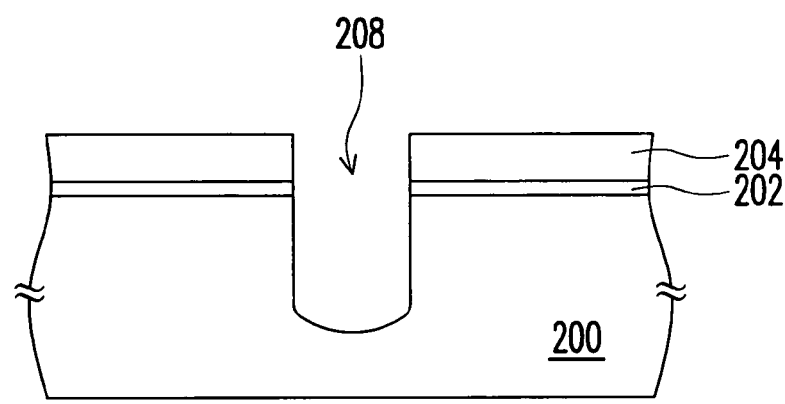
Figure 2C:
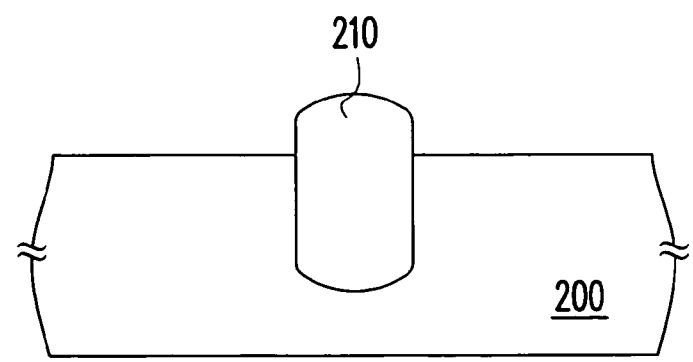

FIGS. 2A through 2C are schematic cross-sectional views showing the steps of a STI process according to the preferred embodiment of this invention. As shown in FIG. 2A, a pad layer 202 and a mask layer 204 are sequentially formed over a substrate 200. The pad layer 202 and mask layer 204 are then patterned to form an opening 206 that exposes a portion of the substrate 200. The pad layer 202 may be a silicon oxide layer formed with, for example, thermal oxidation. The mask layer 204 may be a silicon nitride layer formed with, for example, LPCVD. The mask layer 204 and the pad layer 202 can be patterned using a patterned photoresist layer as an etching mask, which is removed after the patterning process.

Next, a portion of the substrate 200 exposed by the opening 206 is removed through anisotropic etching to form a trench 208. The anisotropic etching process may use a power of about 80 to 120 W, for example. In addition, polymer residue 207 is produced at the bottom of the trench 208 during the etching process.

Then, as shown in FIG. 2B, after an over-etching step is performed to the trench 208, another etching process is performed using a fluorocarbon compound with at least two carbon atoms, He and $O_2$ as an etching gas to remove the polymer residue 207 at the bottom of the trench 208 and to round the bottom corners of the trench 208.

It is noted that the above etching process is a non-isotropic etching process, for example. This non-isotropic etching process means an etching process with different etching rates in different directions. The flow rate of the fluorocarbon compound ranges from 80 sccm to 120 sccm, and the fluorocarbon compound is, for example, $C_2F_6$, $C_3F_8$ or other gas with polymer-rich characteristic. The total flow rate of He and $O_2$ is about 25 to 40 sccm, for example. The pressure in the etching chamber is about 30 to 50 mT. The HF power applied at the upper portion of the etching chamber is about 650 to 950 W, and the LF power at the bottom of the etching chamber is about 95 to 145 W, for example.

In addition, in another preferred embodiment of the invention, the etching gas further includes a fluorocarbon compound with one carbon atom, such as, $CH_2F_2$ or $CF_4$, having a flow rate ranging from 95 sccm to 145 sccm, for example.

Thereafter, as shown in FIG. 2C, an isolation material is filled in the trench 208, and then the isolation material outside the trench 208 is removed to form an isolation layer 210. Next, the patterned mask layer 204 and pad layer 202 are removed.

In order to prove that using the method of the invention can round the bottom corners of a trench effectively, an example is presented below.

After trenches are formed, a non-isotropic etching process as mentioned above is performed to round the bottom corners of the trenches. The etching gas consists of $C_2F_6$, $CH_2F_2$, He and $O_2$. The flow of $CH_2F_2$ is 30 sccm, the total flow rate of He and $O_2$ is 33 sccm, and the flow rate of $C_2F_6$ is 100 sccm. The pressure in the etching chamber is 40 mT. The HP power applied at the upper portion of the etching chamber is 800 W, and the LF power at the bottom of the etching chamber is 120 W.

Figure 3A:
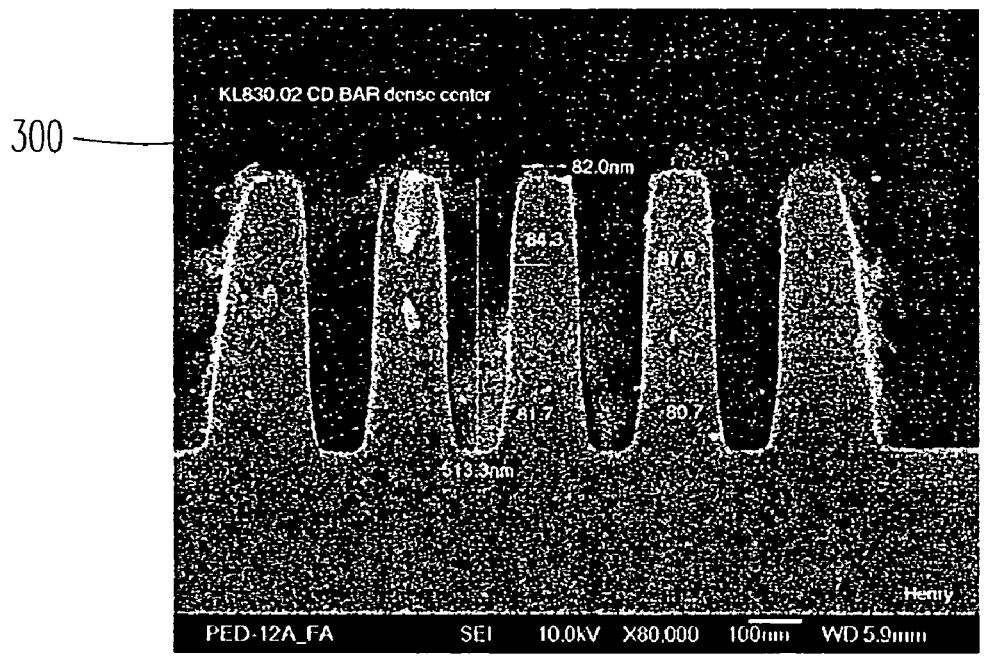
FIG. 3A is a photograph showing a cross-section of the shallow trenches at the center of a wafer that has been treated with the method of the invention.
Figure 3B:
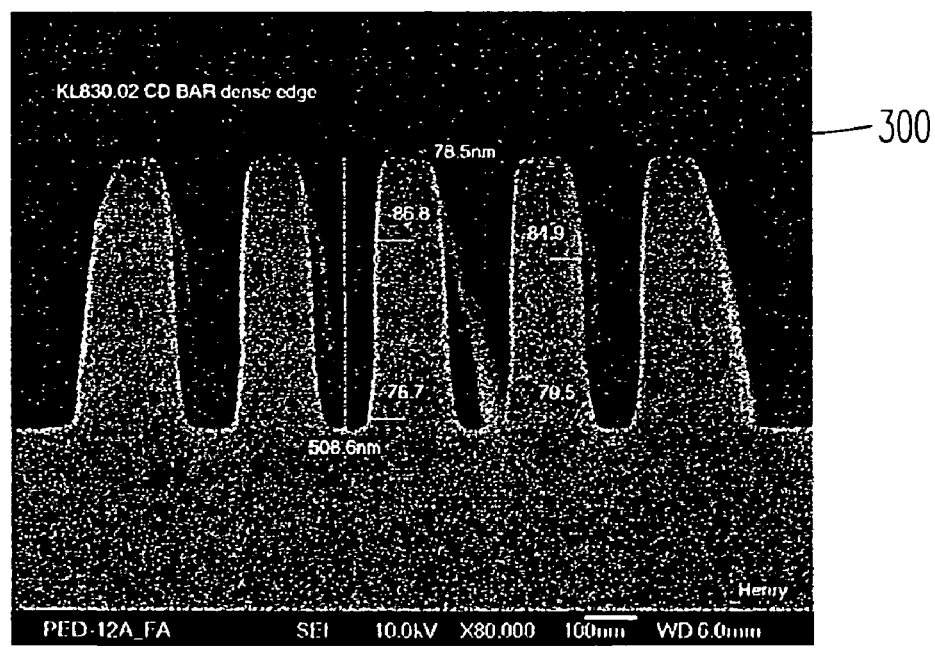
FIG. 3B is a photograph showing a cross-section of the shallow trenches at the edge of the same wafer.

FIGS. 3A and 3B are photographs showing the cross-sections of the shallow trenches 300 at the center and at the edge, respectively, of a wafer having been treated with the non-isotropic etching process. From FIG. 3A/B, it is obvious that the polymer residues at the bottom of the trenches 300 are removed completely, and the bottom corners of the trenches are rounded effectively.

Accordingly, by using a fluorocarbon compound with at least two carbon atoms, He and $O_2$ as an etching gas, the polymer residues at the bottom of the trench can be removed completely, and the bottom corners of the trench can be rounded effectively. Therefore, the problems in the prior art, such as, high stress or point discharge, can be solved.

In addition, the above STI process is merely one of the embodiments of the invention, and is not intended to restrict the scope of the invention. In other words, the above etching process using a fluorocarbon compound with at least two carbon atoms, He and $O_2$ as an etching gas can be performed to any type of trench or opening that is formed in a silicon-based substrate.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for rounding bottom corners of a trench, comprising:
   providing a substrate having a trench therein, and a residue is formed at a bottom of the trench; and
   performing an etching process using a first fluorocarbon compound with at least two carbon atoms, He and $O_2$ as an etching gas to remove the residue and round the bottom corners of the trench, wherein the etching process is performed with a LF power of 95 to 145 W.

2. The method of claim 1, wherein a flow rate of the first fluorocarbon compound ranges from 80 sccm to 120 sccm.

3. The method of claim 1, wherein the first fluorocarbon compound is $C_2F_6$ or $C_3F_8$.

4. The method of claim 1, wherein the etching process comprises a non-isotropic etching process.

5. The method of claim 1, wherein the etching gas further comprises a second fluorocarbon compound with one carbon atom.

6. The method of claim 5, wherein the second fluorocarbon compound is $CH_2F_2$ or $CF_4$.

7. The method of claim 5, wherein a flow rate of the second fluorocarbon compound ranges from 95 sccm to 145 sccm.

8. The method of claim 1, wherein a total flow of He and $O_2$ ranges from 25 sccm to 40 sccm.

9. The method of claim 1, wherein the etching process is performed under a pressure of about 30 to 50 mT.

10. The method of claim 1, wherein the etching process is performed with a HF power of 650 to 950 W.

11. A shallow trench isolation (STI) process, comprising:
    forming a mask layer on a substrate, the mask layer having an opening therein exposing a portion of the substrate;
    removing a portion of the substrate exposed by the opening to form a trench, wherein a residue is formed at a bottom of the trench;
    performing an etching process using a first fluorocarbon compound with at least two carbon atoms, He and $O_2$ as an etching gas to remove the residue and round bottom corners of the trench, wherein the etching process is performed with a LF power of 95 to 145 W; and
    filling an insulating material in the trench.

12. The process of claim 11, wherein a flow rate of the first fluorocarbon compound ranges from 80 to 120 sccm.

13. The process of claim 11, wherein the first fluorocarbon compound is $C_2F_6$ or $C_3F_8$.

14. The process of claim 11, wherein the etching process comprises a non-isotropic etching process.

15. The process of claim 11, wherein the etching gas farther comprises a second fluorocarbon compound with one carbon atom.

16. The process of claim 15, wherein the second fluorocarbon compound is $CH_2F_2$ or $CF_4$.

17. The process of claim 15, wherein a flow of the second fluorocarbon compound ranges from 95 sccm to 145 sccm.

18. The process of claim 11, wherein a total flow of He and $O_2$ ranges from 25 sccm to 40 sccm.

19. The process of claim 11, further comprising an over-etching step between the step of forming the trench and the step of performing the etching process.

20. The process of claim 11, further comprising forming a pad layer on the substrate before the step of forming the mask layer on the substrate.

21. The method of claim 1, wherein the residue is removed and the bottom corners of the trench is rounded simultaneously during the etching process.

22. The method of claim 11, wherein the residue is removed and the bottom corners of the trench is rounded simultaneously during the etching process.

* * * * *